United States Patent
Mao et al.

(10) Patent No.: US 6,421,295 B1
(45) Date of Patent: Jul. 16, 2002

(54) DRAM CIRCUIT AND ITS SUB-WORD LINE DRIVER

(75) Inventors: Robert Mao, San Jose, CA (US); Chung-Zen Chen, Hsinchu; Issac Y. Chen, Hisnchu Hsien, both of (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 59 days.

(21) Appl. No.: 09/783,462

(22) Filed: Feb. 14, 2001

(51) Int. Cl.[7] .................................................. G11C 8/00
(52) U.S. Cl. .............................. 365/230.06; 365/189.11
(58) Field of Search ....................... 365/230.06, 189.11, 365/185.23

(56) References Cited

U.S. PATENT DOCUMENTS

| | | | | |
|---|---|---|---|---|
| 5,184,035 A | * | 2/1993 | Sugibayashi | 365/189.11 |
| 5,946,243 A | * | 8/1999 | Sim | 365/189.11 |
| 6,011,246 A | * | 1/2000 | Oh | 365/230.06 |
| 6,144,589 A | * | 11/2000 | Michelson et al. | 265/189.11 |
| 6,160,753 A | * | 12/2000 | Shibatama | 365/230.06 |
| 6,278,640 B1 | * | 8/2001 | Lines | 365/189.11 |

* cited by examiner

*Primary Examiner*—Tan T. Nguyen
(74) *Attorney, Agent, or Firm*—J.C. Patents

(57) ABSTRACT

A dynamic random access memory (DRAM) circuit and its associated sub-word-line driver. The DRAM circuit includes a boost circuit, a main word line driver and a sub-word line driver. The boost circuit changes its output boost voltage, which lies between an internal supply voltage and an operating voltage, according to an input row access strobe (RAS) signal. The main word line driver is connected to the output terminal of the boost circuit and the main word line, selected according to input address decoding, is driven by the boost voltage. The sub-word line driver is connected to the main word line. An even or odd sub-word-line signal is generated according to the least significant bit of an input address so that voltage level on the main word line can be used to drive the corresponding sub-word line.

11 Claims, 8 Drawing Sheets

DRAM CIRCUIT AND ITS SUB-WORD LINE DRIVER

BACKGROUND OF THE INVENTION

1. Field of Invention

The present invention relates to a dynamic random access memory (DRAM) circuit. More particularly, the present invention relates to a DRAM circuit and its associated sub-word line driver.

2. Description of Related Art

In general, the word lines in a memory unit are designed using a variety of methods. However, some design considerations are fundamental. For example, maintaining a constant potential on the word line so that the memory unit can operate reliably, and limiting propagation delay of signals to memory cells are major considerations. Conventionally, a boost circuit is often added to DRAM to improve performance.

To employ a boost circuit in a DRAM unit, a control signal must be used to monitor the voltage level generated by the boost circuit. The most commonly used signal is a row access strobe (RAS) signal. Typically, when the RAS signal is at a high potential level, the boost circuit will drive the output potential to a voltage needed for operation. On the other hand, when the RAS signal is at a low potential level, the boost circuit will drive the output potential to a level identical to an internal supply voltage. Because this type of architecture uses a single word line, propagation delay for boosting voltage presents little problem when memory capacity is small (such as a 64MB memory unit). However, memory capacity of recent memory units has expanded so much that this type of single-word-line memory circuit may have too large of propagation delay to the memory cells. In other words, the resistance-capacitor (RC) delay is too long and may lead to a lowering of memory operating speed.

To resolve the RC delay time problem, a hierarchical DRAM circuit is developed. FIG. 1 is a block diagram showing a conventional hierarchical DRAM circuit. As shown in FIG. 1, the booster circuit includes a voltage regulator 102, a charge pump 100 and a charge reservoir 104. Boost voltage from the booster circuit is output to a reverse-phase network 108. In addition, the voltage level of the boost voltage is maintained at a constant operation voltage by sensing any difference between the current boost voltage and the desired voltage level through the voltage regulator 102, and boosting the level using the charge pump 100 and holding charges in the charge reservoir 104. Thereafter, the address stored in an address buffer 110 is sent to decoders 112 and 114. The decoded results determine whether a main word line (MWL) driver 118 drives the main word line or a main word line driver 120 drives the main word line. Furthermore, the least significant bit in the address is decoded by a decoder 116 to determine the output from a reverse-phase network 108 via a selection signal SELN. Hence, one of the sub-word line (SWL) drivers (such as sub-word line drivers 122, 124, 126 etc.) is selected. With this arrangement, the boost voltage can be rapidly transferred from the reverse-phase network 108 via signal line BST to a target memory cell for reading (such as memory cell 130) according to the selected main word line and signal SELN selected sub-word line.

Due to various combinations between main word lines and sub-word lines, the path needed for a boost voltage to propagate to a particular memory cell is shortened. Hence, operating time is also shortened. However, to be able to supply the desired output operating voltage at any time, the voltage level of the boost voltage must be maintained at the operating voltage level. Consequently, this type of design is bound to waste a lot of energy unnecessarily.

In summary, defects in a conventional DRAM circuit and its associated sub-word line driver design include:

1. Single word line architecture is acceptable only for memory having a small memorizing capacity because the operating delay will be too large for a large capacity memory.
2. In hierarchical circuit design, the voltage level of the boosting voltage must be maintained at a high operating voltage, thereby wasting a lot of energy.

SUMMARY OF THE INVENTION

Accordingly, one object of the present invention is to provide a dynamic random access memory (DRAM) circuit having a boost circuit, a main word line driver and a sub-word line driver. The boost circuit changes its output boost voltage, which lies between an internal supply voltage and an operating voltage, according to an input row access strobe (RAS) signal. The main word line driver is connected to the output terminal of the boost circuit. The main word line is selected according to the input address decoding driven by the boost voltage. The sub-word line driver is connected to the main word line. An even or odd sub-word-line signal is generated according to the least significant bit of an input address so that the voltage level of the main word line can be used to drive the corresponding sub-word line.

This invention also provides a sub-word line driver for DRAM. The sub-word line driver includes a first and second relay transistor, a first and second pull-down transistor, and a first and second pass transistor. The source/drain terminals of the first relay transistor are connected to a main word line and an even sub-word line. The gate terminal of the first relay transistor is connected to an odd sub-word line. The source/drain terminals of the second relay transistor are connected to the main word line and the odd sub-word line. The gate terminal of the second relay transistor is connected to the even sub-word line. The source/drain terminals of the first pull-down transistor are connected to the even sub-word line and a reference voltage point. The gate terminal of the first pull-down transistor is connected to a terminal for receiving an even sub-word-line signal. The source/drain terminals of the second pull-down transistor are connected to the odd sub-word line and the reference voltage point. The gate terminal of the second pull-down transistor is connected to a terminal for receiving an odd sub-word-line signal. The source/drain terminals of the first pass transistor are connected to the main word line and the even sub-word line. The gate terminal of the first pass transistor is connected to the terminal for receiving the odd sub-word-line signal. The source/drain terminals of the second pass transistor are connected to the main word line and the odd sub-word line. The gate terminal of the second pass transistor is connected to the terminal for receiving the even sub-word-line signal.

In brief, this invention employs a hierarchical DRAM circuit and a system for automatically changing the voltage level of a boost voltage. Besides the capacity for a faster response from the circuit, considerable power is saved as well. In addition, the sub-word line driver in this invention is capable of controlling a pair of sub-word lines, thereby reducing the length of the main word line considerably. Since the path and propagation time of the boost voltage is shortened compared with a conventional hierarchical DRAM circuit, the operating speed of the memory is greatly increased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
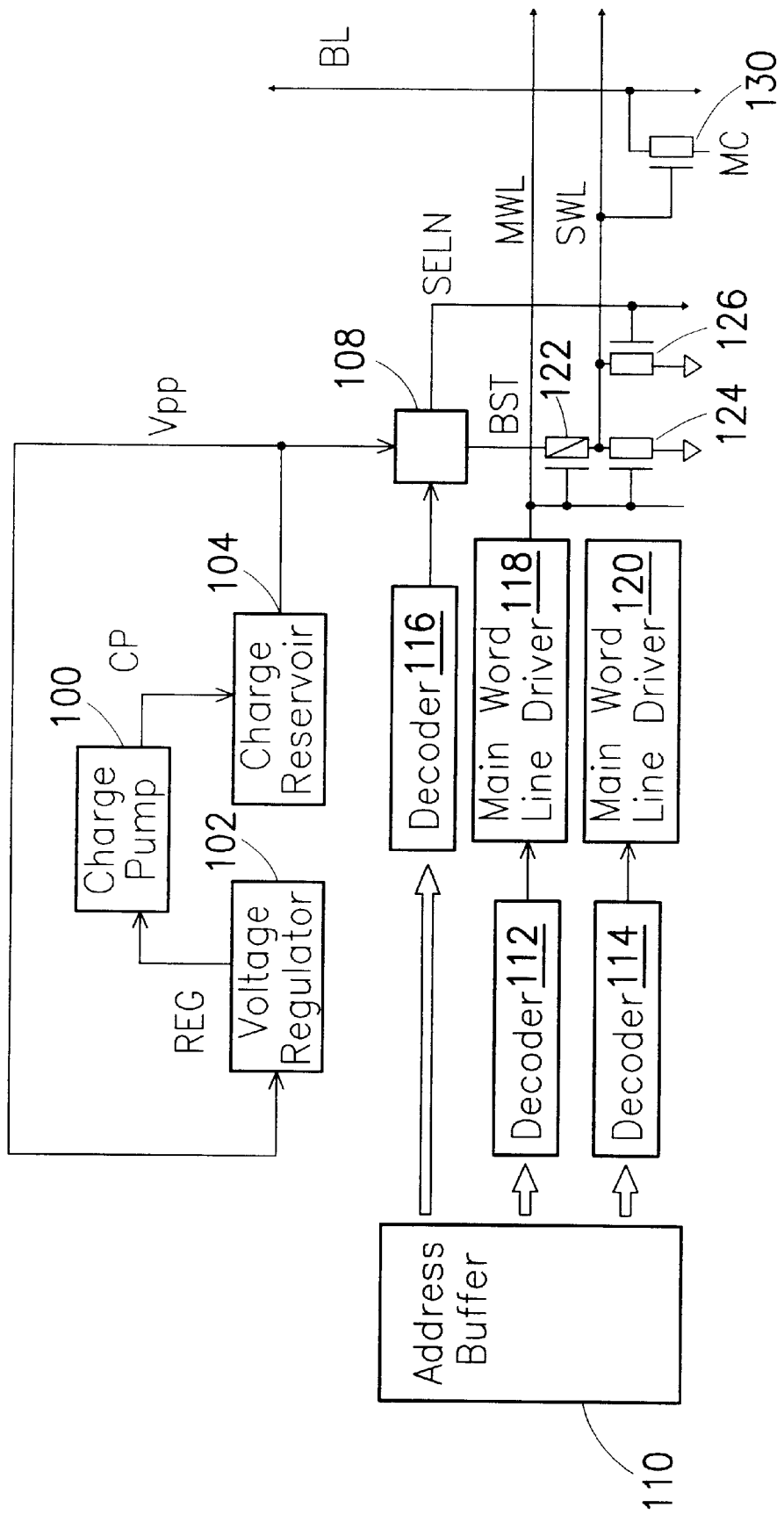
FIG. 1 is a block diagram showing a conventional hierarchical DRAM circuit.

Reference will now be made in detail to the preferred embodiments of the present invention, examples of which are illustrated in the accompanying drawings. Wherever possible, the same reference numbers are used in the drawings and the description to refer to the same or like parts.

Figure 2:
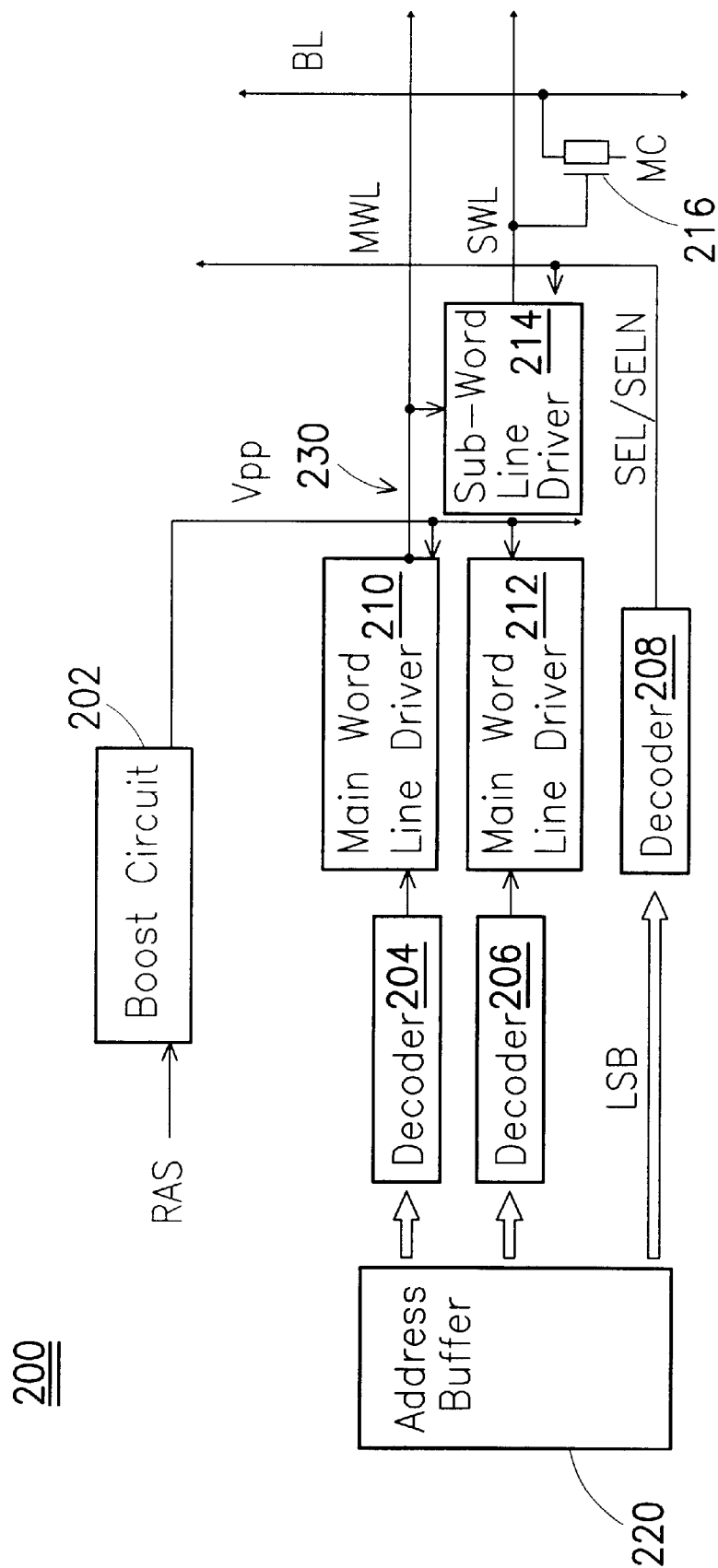
FIG. 2 is a block diagram showing a hierarchical DRAM circuit according to a preferred embodiment of this invention.

FIG. 2 is a block diagram showing a hierarchical DRAM circuit according to a preferred embodiment of this invention. As shown in FIG. 2, the DRAM circuit 200 includes a boost circuit 202, a plurality of decoders 204, 206, and 208, a main word line driver 210, a sub-word line driver 214, a memory cell array (MC) 216 and an address buffer 220. Note that the numbers of decoders, main word line drivers and sub-word line drivers shown in FIG. 2 are for illustration purposes only. In practice, the actual numbers can be freely chosen.

Boost circuit 202 receives a row access strobe (RAS) signal and outputs a corresponding boost voltage according to the voltage level of the received RAS signal. For example, if the DRAM circuit 200 has an internal supply voltage and an operating voltage, boost circuit 202 is capable of driving the boost voltage to a level identical to the supply voltage or the operating voltage according to the RAS signal level. The main word line drivers 210 and 212 are connected to the output terminal of boost circuit 202. Input addresses stored in the address buffer 220 are decoded by decoders 204 and 206. The decoded address is used for controlling the operation of one of the main word line drivers (210 and 212) so that the boost voltage supplied by boost circuit 202 to drive a selected main word line can be utilized (for example, main word line 230 is driven by main word line driver 210). Note that the main word line is not drawn in the main-word-line driver 212 for clarity. Anyone familiar with such a technique may know that the main word line driver is used mainly for driving the main word line and should be electrically coupled to the main word line.

In addition, a sub-word line driver 214 is electrically connected to the main word line 230. The least significant bit of the input address stored inside the address buffer 220 is decoded by the decoder 208. An even sub-word-line signal or an odd sub-word-line signal is output according to the results obtained from the decoder 208. In this embodiment, if the decoded result from the decoder 204 shows that the main word line 230 needs to be driven, a boost voltage will propagate via the main word line driver 210 to the main word line 230. Thereafter, the even sub-word-line signal (Sel) or the odd sub-word-line signal (Seln) output depending on the decoding of the least significant bit determines the target of transmission of boost voltage on the main word line 230 to the sub-word line driver 214. Note that although main word line 230 is coupled to a sub-word line driver 214 in FIG. 2, in practice there is no limitation in coupling.

Figure 3A:
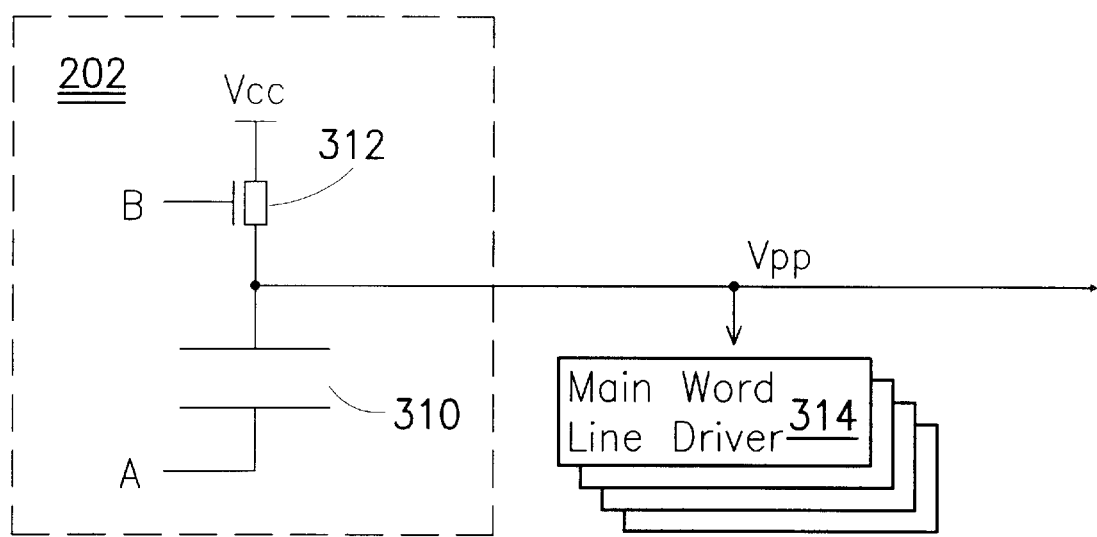
FIG. 3A is a circuit diagram showing in detail the boost circuit shown in FIG. 2.

FIG. 3A is a circuit diagram of the boost circuit 202 shown in FIG. 2. As shown in FIG. 3A, the boost circuit 202 includes a voltage-boosting capacitor 310 and a voltage pre-charging transistor 312. Also refer to FIG. 3B, which is a timing diagram showing the signal relationship for the circuit shown in FIG. 3A. In this embodiment, the RAS signal at a low potential implies the DRAM is in a standby mode. In the standby mode, the boost voltage is at the internal supplied voltage Vcc level because voltage is able to pass through the voltage pre-charging transistor 312. On the other hand, the RAS signal at a high potential implies data inside DRAM must be accessed. To carry out data access, boost voltage is provided by the voltage-boosting capacitor 310 so that the required operating voltage is attained. In FIG. 3A, signals A and B change according to the electric potential provided by the RAS signal. In other words, when the RAS signal is at a high potential, signal A is converted into a high potential while signal B is converted into a low potential. When the RAS signal is at a low potential, signal A is converted into a low potential while signal B is converted into a high potential.

Figure 3B:
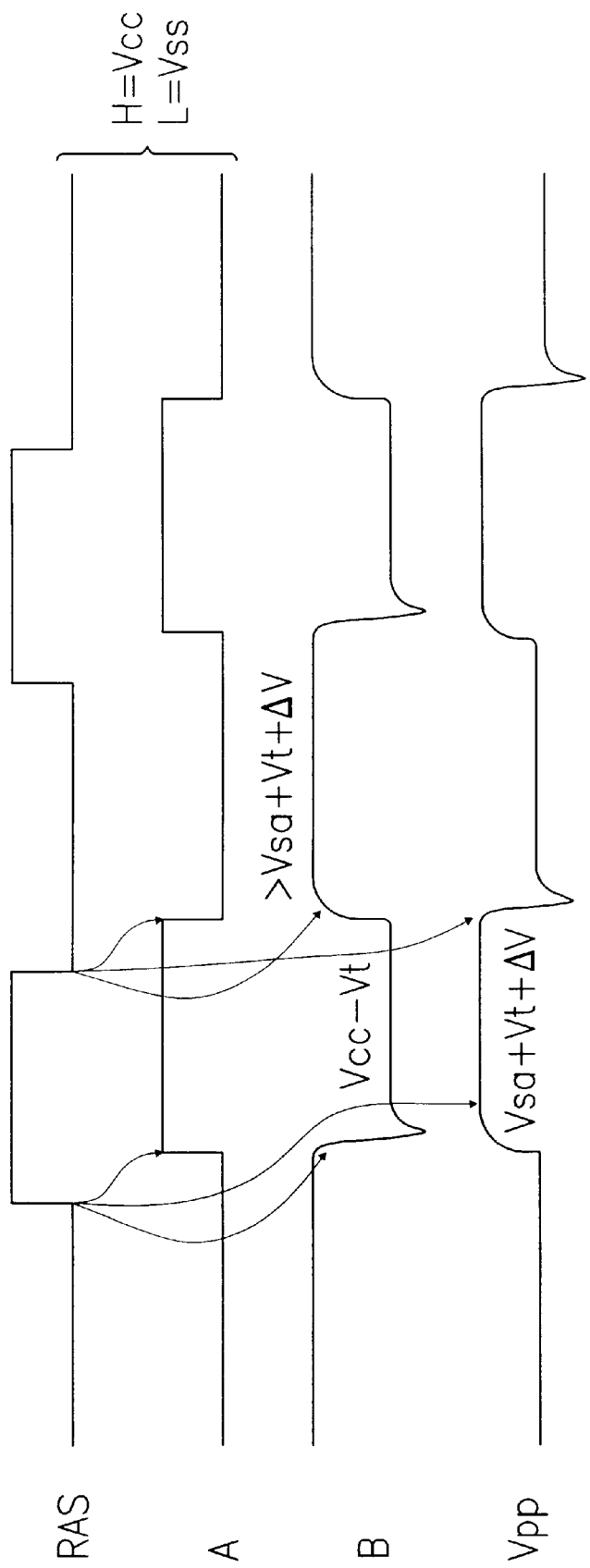
FIG. 3B is a timing diagram showing the signal relationship for the circuit shown in FIG. 3A.

Note that in DRAM standby mode, signal B at a high potential must be higher than the operating voltage in order to have a boost voltage large enough to pre-charge to a state identical to the internal supply voltage. For example, to insure a complete transmission between the storage node and the bit line, the potential voltage must be at least the sum of the voltage of the bit line Vsa plus the voltage of the memory cell array 216 Vt. Additionally, the output voltage Vpp further comprises a voltage $\Delta V$ to guarantee that Vpp is Vsa+Vt+$\Delta V$ in order to maintain the transmission process. For this reason, the output voltage Vpp is like FIG. 3B shows. However, in order to get the same result, the voltage of signal B must be higher than this voltage. In addition, the output voltage Vpp of the boost circuit can be coupled to a plurality of main word drivers (for example, 314). The total number of main-word-line drivers attached to the boost circuit depends on the actual design. Hence, the number shown in FIG. 3A is for reference only.

Figure 4A:
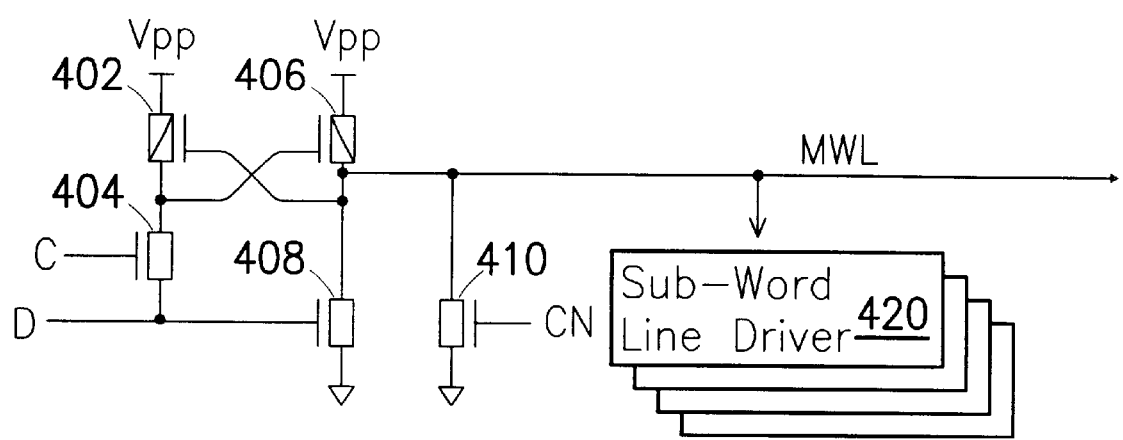
FIG. 4A is a circuit diagram showing in detail one of the main word line drivers shown in FIG. 2.

FIG. 4A is a circuit diagram showing in detail one of the main word line drivers (210 or 212) shown in FIG. 2. As shown in FIG. 4A, four transistors 402, 404, 406, and 408 together form a level shifter. The P-type MOS transistor 402 and 406 are cross-coupled to serve as a P-type latch. The N-type MOS transistor 404 serves as a pass ransistor in the level shifter. As potential at the main word line MWL drops, the $n^{th}$ column MOS transistor 410 serves as a pull-down device. Signals C and D are provided by the decoder 204 or

Figure 4B:
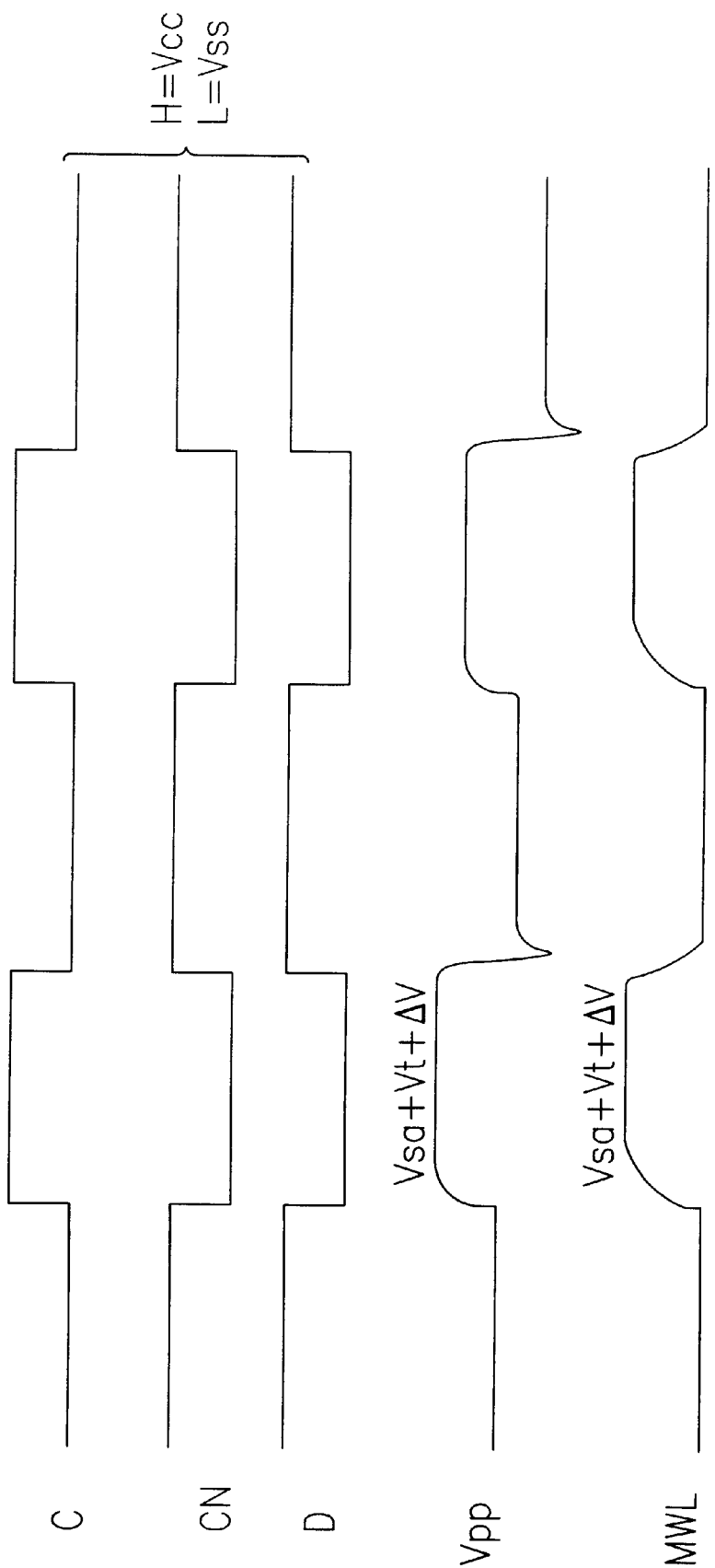
FIG. 4B is a timing diagram showing the signal relationship for the circuit shown in FIG. 4A.

206 according to the result of the address decoding. After an input address is decoded, the main word line drivers will be selected. Also refer to FIG. 4B. The decoder that corresponds to the selected main word line driver will generate signals C and D. For example, when the main word line driver shown in FIG. 4A is chosen, signal C will be pushed to a high potential level while signal D will be pulled to a low potential level. Signal D terminates the function of transistor 408 while permitting current to go through transistor 404. With such an operating procedure, the voltage level on the main word line (MWL) will be pushed to the boost voltage Vpp (Vsa+Vt+ΔV) via transistor 406. On the contrary, when the potential level of RAS signal drops, the boost voltage Vpp will be pre-charged to a level identical to internal supply voltage Vss. Meanwhile, signal C will be pulled to a low potential level while signal D will be pushed to a high potential level. Hence, the aforementioned P-type latch will trigger transistor 408 into a conductive state. In the meantime, since signal CN is a complementary signal of C, the potential level of signal CN will rise leading to the conductance of transistor 410 as the potential level of signal C drops. Ultimately, the voltage at the main word line (MWL) is pulled to a low level.

Figure 5A:
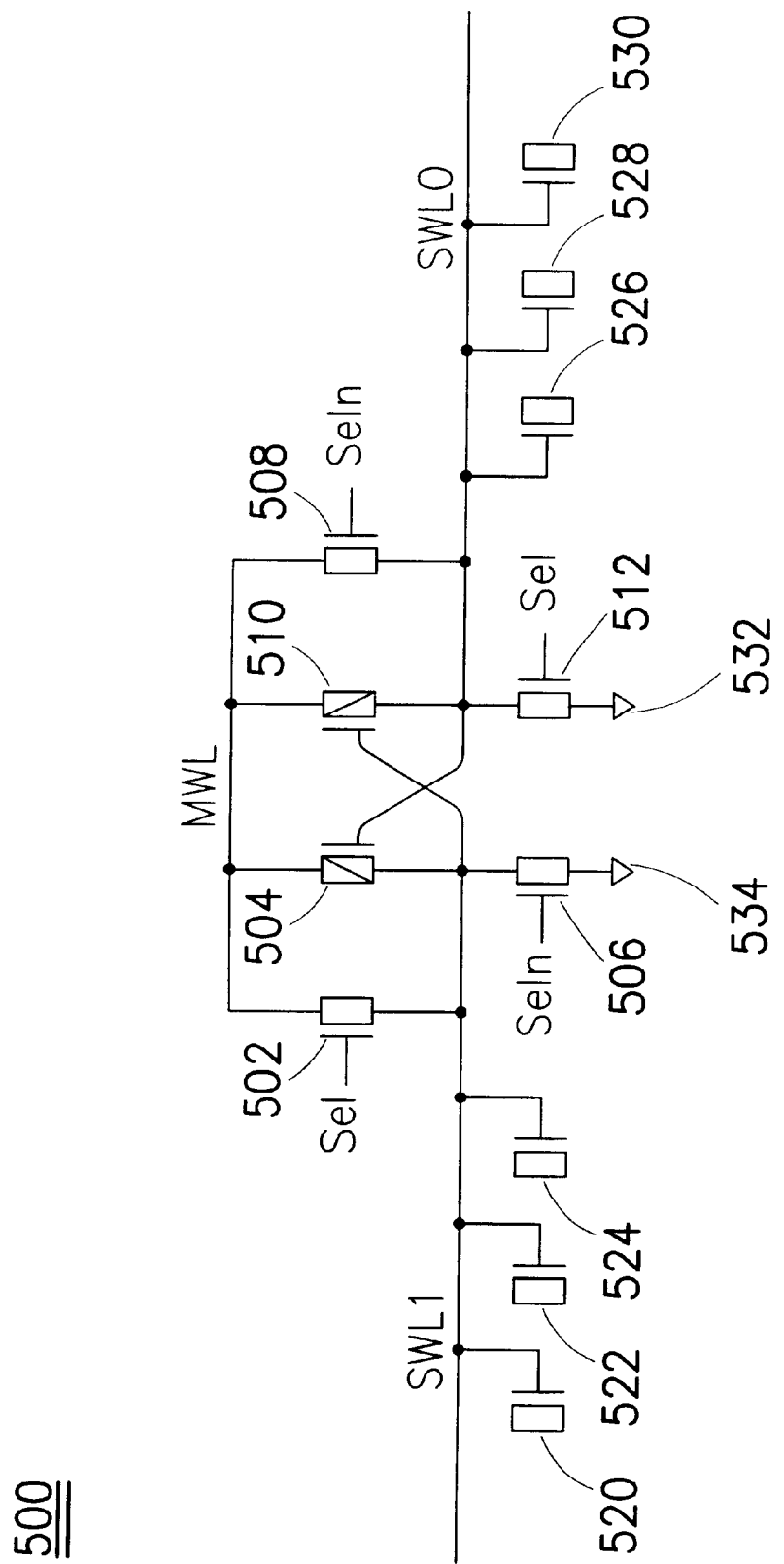
FIG. 5A is a circuit diagram showing in detail the sub-word line driver shown in FIG. 2.

FIG. 5A is a circuit diagram showing in detail the sub-word line driver shown in FIG. 2. As shown in Fig. 5A, the sub-word line driver 500 includes a pair of relay transistors 504 and 510, a pair of pull-down transistors 506 and 512, and a pair of pass transistors 502 and 508. The source/drain terminals of a relay transistor 510 are connected to the main word line (MWL) and an even sub-word line (SWL0) and the gate terminal of the relay transistor 510 is connected to an odd sub-word line (SWL1). The source/drain terminals of the relay transistor 504 are connected to the main word line (MWL) and the odd sub-word line (SWL1) and the gate terminal of relay transistor 504 is connected to the even sub-word line (SWL0). The source/drain terminals of the pull-down transistor 512 are connected to the even sub-word line (SWL0) and a reference voltage point 532 and the gate terminal of pull-down transistor 512 is connected to the even sub-word-line signal terminal (Sel). The source/drain terminals of pull-down transistor 506 are connected to the odd sub-word line (SWL1) and the reference voltage point 532 and the gate terminal of pull-down transistor 506 is connected to the odd sub-word-line signal terminal (Seln). The source/drain terminals of the pass transistor 508 are connected to the main word line (MWL) and the even sub-word line (SWL0) and the gate terminal of the pass transistor 508 is connected to the odd sub-word-line signal terminal (Seln). The source/drain terminals of the pass transistor 502 are connected to the main word line (MWL) and the odd sub-word line (SWL1) and the gate terminal of the pass transistor 502 is connected to the even sub-word-line signal terminal (Sel).

Figure 5B:
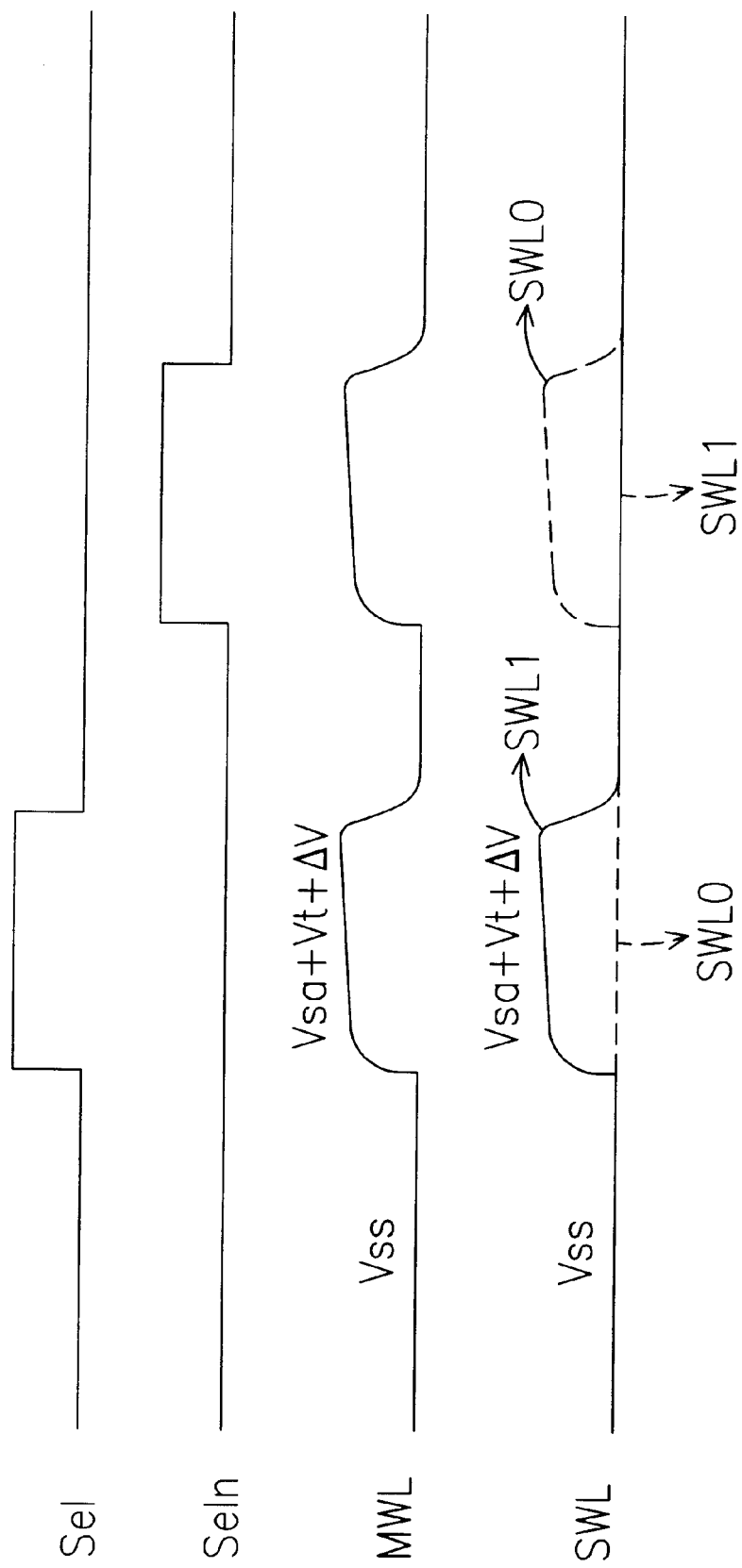
FIG. 5B is a timing diagram showing the signal relationship for the circuit shown in FIG. 5A.

According to the circuit architecture shown in FIG. 5A and the signal relationship shown in FIG. 5B, as the even/odd sub-word-line signal (Sel, Seln) derived from the least significant bit of decoded input address arrives, the voltage level on the main word line (MWL) will propagate to the corresponding sub-word lines. Through the voltage propagation, memory cells 520~530 having connection with the sub-word line (SWL0 or SWL1) are able to obtain the needed operating voltage. Obviously, the number of memory cells coupled to each sub-word line is a variable that depends on individual design and the three memory cells shown in FIG. 5A are for illustration purposes only.

In summary, the invention is able to provide a faster response from the circuit along with the saving of considerable power. In addition, the sub-word line driver in this invention is capable of controlling a pair of sub-word lines, thereby reducing the length of the main word line considerably.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A dynamic random access memory (DRAM) circuit, comprising:
   a boost circuit for outputting a boost voltage, wherein voltage level of the boost voltage changes according to an input row access strobe (RAS) signal, and voltage level of the boost voltage lies between an internal supply voltage and an operating voltage;
   a main word line driver coupled to the output terminal of the boost circuit, wherein the selection of one of the main word lines is driven by the boost voltage according to the result of decoding an input address; and
   a sub-word line driver coupled to the main word line, wherein the sub-word line is driven by the voltage on the main word line according to an even/odd sub-word-line signal generated by the decoded least significant bit of an input address.

2. The DRAM circuit of claim 1, wherein the boost circuit further includes:
   a voltage-boosting capacitor for pushing voltage level of the boost voltage to the operating voltage level according to input RAS signal; and
   a voltage pre-charging transistor for pushing voltage level of the boost voltage to a level identical to the internal supply voltage according to input RAS signal.

3. The DRAM circuit of claim 2, wherein the voltage-boosting capacitor is used to push voltage level of the boost voltage when the RAS signal is at a high potential and the voltage pre-charging transistor is used to push voltage level of the boost voltage when the RAS signal is at a low potential.

4. The DRAM circuit of claim 1, wherein the sub-word line driver further includes:
   a first relay transistor and a second relay transistor, wherein the source/drain terminals of the first relay transistor are connected to a main word line and an even sub-word line, the gate terminal of the first relay transistor is connected to an odd sub-word line, the source/drain terminals of the second relay transistor are connected to the main word line and the odd sub-word line, and the gate terminal of the second relay transistor is connected to the even sub-word line;
   a first pull-down transistor and a second pull-down transistor, wherein the source/drain terminals of the first pull-down transistor are connected to the even sub-word line and a reference voltage point, the gate terminal of the first pull-down transistor is connected to a terminal for receiving an even sub-word-line signal, the source/drain terminals of the second pull-down transistor are connected to the odd sub-word line and the reference voltage point, and the gate terminal of the second pull-down transistor is connected to a terminal for receiving an odd sub-word-line signal; and
   a first pass transistor and a second pass transistor, wherein the source/drain terminals of the first pass transistor are connected to the main word line and the even sub-word line, the gate terminal of the first pass transistor is connected to the terminal for receiving the odd sub-word-line signal, the source/drain terminals of the second pass transistor are connected to the main word line and the odd sub-word line, and the gate terminal of the second pass transistor is connected to the terminal for receiving the even sub-word-line signal.

5. The DRAM circuit of claim 4, wherein the even sub-word line and the odd sub-word line are each coupled to at least one memory cell.

6. A dynamic random access memory (DRAM) circuit, comprising:

a boost circuit that includes a voltage-boosting capacitor and a voltage pre-charging transistor, wherein the voltage-boosting capacitor pushes voltage level of the boost voltage to an operating voltage level according to input RAS signal and the voltage pre-charging transistor pushes voltage level of the boost voltage to a level identical to an internal supply voltage according to input RAS signal;

a main word line driver coupled to the output terminal of the boost circuit, wherein the selection of one of the main word lines is driven by the boost voltage according to the result of decoding an input address; and a sub-word line driver coupled to the main word line comprising of a first relay transistor, a second relay transistor, a first pull-down transistor, a second pull-down transistor, a first pass transistor and a second pass transistor, wherein a first relay transistor and a second relay transistor, wherein the source/drain terminals of the first relay transistor are connected to a main word line and an even sub-word line, the gate terminal of the first relay transistor is connected to an odd sub-word line, the source/drain terminals of the second relay transistor are connected to the main word line and the odd sub-word line, and the gate terminal of the second relay transistor is connected to the even sub-word line; the source/drain terminals of the first pull-down transistor are connected to the even sub-word line and a reference voltage point, the gate terminal of the first pull-down transistor is connected to a terminal for receiving an even sub-word-line signal, the source/drain terminals of the second pull-down transistor are connected to the odd sub-word line and the reference voltage point, and the gate terminal of the second pull-down transistor is connected to a terminal for receiving an odd sub-word-line signal; the source/drain terminals of the first pass transistor are connected to the main word line and the even sub-word line, the gate terminal of the first pass transistor is connected to the terminal for receiving the odd sub-word-line signal, the source/drain terminals of the second pass transistor are connected to the main word line and the odd sub-word line, and the gate terminal of the second pass transistor is connected to the terminal for receiving the even sub-word-line signal.

7. The DRAM circuit of claim 6, wherein the voltage-boosting capacitor is used to push voltage level of the boost voltage when the RAS signal is at a high potential and the voltage pre-charging transistor is used to push voltage level of the boost voltage when the RAS signal is at a low potential.

8. The DRAM circuit of claim 6, wherein the even sub-word line and the odd sub-word line are each coupled to at least one memory cell.

9. A sub-word line driver for a dynamic random access memory (DRAM), comprising:

a first relay transistor and a second relay transistor, wherein the source/drain terminals of the first relay transistor are connected to a main word line and an even sub-word line, the gate terminal of the first relay transistor is connected to an odd sub-word line, the source/drain terminals of the second relay transistor are connected to the main word line and the odd sub-word line, and the gate terminal of the second relay transistor is connected to the even sub-word line;

a first pull-down transistor and a second pull-down transistor, wherein the source/drain terminals of the first pull-down transistor are connected to the even sub-word line and a reference voltage point, the gate terminal of the first pull-down transistor is connected to a terminal for receiving an even sub-word-line signal, the source/drain terminals of the second pull-down transistor are connected to the odd sub-word line and the reference voltage point, and the gate terminal of the second pull-down transistor is connected to a terminal for receiving an odd sub-word-line signal; and a first pass transistor and a second pass transistor, wherein the source/drain terminals of the first pass transistor are connected to the main word line and the even sub-word line, the gate terminal of the first pass transistor is connected to the terminal for receiving the odd sub-word-line signal, the source/drain terminals of the second pass transistor are connected to the main word line and the odd sub-word line, and the gate terminal of the second pass transistor is connected to the terminal for receiving the even sub-word-line signal.

10. The sub-word line driver of claim 9, wherein the even sub-word-line signal and the odd sub-word-line signal are derived from the least significant bit of the memory address to be read.

11. The sub-word line driver of claim 9, wherein the even sub-word line and the odd sub-word line are each coupled to at least one memory cell.

* * * * *